May 30, 1961 P. G. WRAY 2,986,649

TRANSISTOR MULTIVIBRATOR CIRCUITS

Filed Oct. 25, 1955

INVENTOR
PHILLIP G. WRAY

BY Emery Robinson
ATTORNEY

United States Patent Office 2,986,649

Patented May 30, 1961

2,986,649

TRANSISTOR MULTIVIBRATOR CIRCUITS

Phillip G. Wray, Niles, Ill., assignor to Teletype Corporation, Chicago, Ill., a corporation of Delaware Filed Oct. 25, 1955, Ser. No. 542,725

5 Claims. (Cl. 307—88.5)

This invention relates to transistor multivibrator circuits and more particularly to transistor multivibrators which may be controlled and triggered into bi-stable or mono-stable operation.

In this invention transistors of the type known as junction transistors are utilized. An example of such a transistor is disclosed in Patent No. 2,569,347, granted September 25, 1951, to W. Shockley and generally comprises a semiconductive body, for example, a germanium or silicon having therein a zone of one conductivity type, N or P, between and contiguous with two zones of the opposite conductivity type. The emitter and collector connections are made respectively through the outer zones and a third connection, termed the base, is made to the intermediate zone. The several zones define two junctions, which will be referred to herein as the emitter and collector junctions. In general, in the operation of the device the collector junction is biased in a reversed or high resistance direction and the emitter junction is biased in a forward or low resistance direction.

In many electrical installations such as computers, switching systems, counters, telegraph transmitting equipment and others, it is necessary to utilize multivibrator circuits. Direct coupled multivibrator circuits have been developed wherein two stable states of equilibrium are attainable. In these circuits the application of a trigger pulse usually renders a normally operative stage of the multivibrator nonoperative and at the same time, renders the nonoperative stage operative. Where transistors are used as control elements in the multivibrator, it is possible to cross couple the transistors to attain very fast operation through a regenerative feed-back action. Further, it is possible to couple the transistors in the multivibrators so as to obtain mono-stable operation; that is, the application of a trigger pulse will only render the nonoperative stage operative for an instant and thereafter the multivibrator restores to its initial condition. With presently known multivibrator circuits, it has been only possible to obtain either a bi-stable or mono-stable operation by making physical changes in the connections between components.

It is a primary object of this invention to provide a transistor controlled multivibrator that may be triggered into either a bi-stable or mono-stable operation.

Another object of the invention resides in a transistor multivibrator that may be normally bi-stable in operation, but upon application of a suitable control potential the multivibrator automatically becomes a mono-stable device.

A further object of the invention is to provide a transistor multivibrator having a coupling running from the emitters of the transistors to a common resistance that is connected to ground potential.

Concomitant with the last object an additional object is to provide a mono-stable transistor multivibrator depending in its operation upon a regenerative action resulting from the potential developed across a common emitter resistance.

A still further object of the invention resides in a transistor multivibrator wherein rapid operation is obtained through (1) a regenerative action resulting from a feed-back running from the collector of one transistor to the base of the other and (2) a regenerative action due to a coupling connected to the emitters of each transistor and to a comon resistance.

With these and other objects in view the present invention contemplates a pair of transistors having their respective emitters coupled together and to a common resistance. The collector of each transistor is coupled through a resistance circuit to the base of the other transistor. A suitable potential is applied to the respective collectors to cause one of said transistors to be placed in a conductive state. The application of trigger pulses to the base of the conductive transistor causes this transistor to assume a nonconductive state and simultaneously therewith the other transistor is rendered conductive. This circuit is a bistable multivibrator circuit.

If a suitable conditioning potential is applied to the coupling running from the conductive transistor's collector to the base of the nonconducting transistor then the application of a trigger pulse to the conducting transistor will again render this transistor nonconducting and the other transistor conductive. However, due to the control potential applied to the base of the now conducting transistor, this transistor cannot maintain its conductive state and hence its circuit restores to its initial condition. This action is due to the coupling of emitters which permits the emitter of the nonconducting transistor to rise, hence driving the emitter positive with respect to the control potential applied to the base of the nonconducting transistor. Obviously, when this occurs the nonconducting transistor is rendered conducting but as soon as it is rendered conducting its emitter potential starts to drop, hence the period of conduction is of only instant duration. The conductive period may be prolonged by connecting a capacitance in parallel with the coupling circuit running from the normally conducting transistor to the base of the normally nonconducting transistor. It will be understood that by the mere application of this control potential the circuit has been changed from a bi-stable multivibrator to a mono-stable multivibrator.

Other objects and advantages of the present invention will be apparent from the following detailed description when considered in conjunction with the accompanying drawings wherein.

Figure 1:
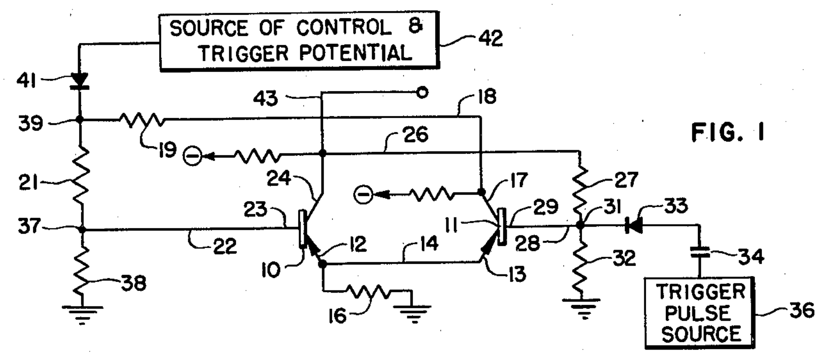
Fig. 1 shows a multivibrator that is capable of either bi-stable or mono-stable operation in accordance with the principles of the invention.

Referring to Fig. 1 there is shown a pair of transistors 10 and 11 of the type shown in the afore-identified patent to Shockley. It is to be understood that point contact transistors of the type shown in the patent to Bardeen et al., No. 2,524,035, issued October 3, 1950, may also be utilized. Each transistor has an emitter designated respectively by the reference numerals 12 and 13 which are coupled together by a lead 14. This lead is also connected to a resistance 16 running to ground. Collector 17 of transistor 11 is connected over a lead 18, through a resistance 19, through a resistance 21 and a lead 22 to a base 23 of the transistor 10. A collector 24 of transistor 10 is coupled through a lead 26, through a resistance 27 and a lead 28 to a base 29 of the transistor 11. A junction point 31 connected between the resistance 27 and the lead 28 is also connected through a resistance 32 to ground. Further junction point 31 is coupled to a diode 33 which in turn is connected through a capacitance 34 to a source of trigger pulse 36.

Resistance 21 is connected to lead 22 by means of a junction point 37 which is also connected through a resistance 38 to ground. A junction point 39 between the resistances 19 and 21 is connected to a diode 41 that is controlled by a source of control potential 42. The source of control potential 42 may be of any suitable type to produce increased steady potential conditions or merely pulses of increased potential. If resistance 27 is made slightly less than the sum of resistances 19 and 21, then the application of negative potentials to the collectors 17 and 24 results in the rendering of transistor 11 conductive. However, if resistance 27 is selected to be equal to the sum of resistances 19 and 21, the application of suitable potential to the collector will still result in the rendering of one transistor conductive due to the impossibilty of making equal the circuit parameters associated with each transistor.

Now assume that the source of control potential 42 does not apply a potential to the diode 41 that is greater than the potential existing at the junction point 39, then the application of a positive going trigger pulse from the source 36 will pass through the diode 33, through the junction point 31 and over the lead 28 to the base 29 of the transistor 11. A rise in potential on the base 29 causes this transistor to decrease in conductivity whereupon its emitter potential immediately starts to rise. As the potential on the lead 14, due to the rise in the potential of emitter 13, approaches ground potential a point will be reached wherein the potential applied to the emitter 12 will be slightly positive with respect to the potential applied on the base 23 of the transistor 10. When this occurs the transistor 10 commences conduction whereupon its collector potential 24 starts to rise. The rise in collector potential is impressed over coupling lead 26, through the resistance 27, through the lead 28, to the base 29 of the transistor 11, hence re-enforcing the positive going pulse previously impressed on the base 29.

As the transistor 11 assumes a nonconductive state its collector potential starts to drop and as a result a drop in potential is impressed over the lead 18 through the resistances 19 and 21 and over the lead 22 to the base of the transistor 10, manifestly, driving this base further negative with respect to its emitter 12 and thereby favoring further conduction of the transistor 10. This regenerative action continues until the transistor 11 is fully cut off and the transistor 10 is fully conducting.

If a positive going control pulse is applied from the source 42 through the diode 41 and from there through the resistance 21 over the lead 22 to the base 23 of the transistor 10, then this transistor is driven towards a state of nonconduction in the same manner that the transistor 11 was shut off by the application of a positive going pulse from the source 36. The circuit thus described is a bi-stable multivibrator that may be triggered to two stable conditions of operation upon application of appropriate positive going pulses from the sources 36 and 42.

Assume for purposes of illustration that the transistor 11 is rendered conductive and that a steady potential condition is applied from the source 42 which is sufficient to render the diode 41 conductive so that the junction point 39 assumes the increased potential attributed thereto by the source 42. In such a situation the application of a positive going pulse from the source 36 to the base 29 of the transistor 11 will again tend to drive this transistor to a state of nonconduction. In such a situation the emitter potential of transistor 11 again rises to cause a corresponding increase in the potential applied to the emitter 12. As soon as the emitter 12 rises to a point where it is positive with respect to the base 23 the transistor 10 will commence conduction. As the transistor 11 is cut off its collector potential drops, however, this drop in potential does not pass through the junction point 39 because now this junction point is controlled by the potential applied from the source 42 which is at a relatively high value. Hence, the previously discussed regenerative action attributable to the drop in collector potential of the transistor 11 is not capable of driving the base 23 negative, thus the conduction of the transistor 10 depends solely upon the difference in potential between the emitter 12 and the fixed potential of the base 23. There is a regenerative action with respect to the drop in collector potential of the transistor 10 which is due to the rise in collector potential which is impressed over the lead 26 through the resistance 27 over the lead 28 to the base 29. As previously discussed this feature acts to re-enforce the effect of the initial pulse impressed on the base 29 from the source 36.

As the transistor 10 is driven to a further state of conduction the emitter potential will drop until it is no longer positive with respect to the base and as a result the transistor 10 will no longer be able to continue conduction. It is to be noted that during the period of conduction of transistor 10 the base potential cannot drop due to the connection to junction point 37 which is maintained at a relatively high potential by the source 42, consequently the potential gradient between the base and emitter is not sufficient to sustain conduction for any prolonged period of time. When transistor 10 starts to become nonconductive again its collector potential drops to apply a decreased potential over the lead 26 through the resistance 27 over the lead 28 to the base 29 of transistor 11. Appearance of this negative going potential on the base 29 immediately starts conduction of the transistor 11. Upon commencement of conduction of transistor 11, the emitter potential thereof immediately starts to drop, thus causing the potential on the emitter 12 of the transistor 10 to likewise decrease therefore furthering the shutting off action of the transistor 10. This action is in effect a regenerative feedback action attributable to the common resistance coupling between the emitters 12 and 13.

When the control potential from the source 42 is removed, then the blocking potential at junction point 39 is removed and hence the regenerative circuit consisting of the lead 18, the resistance 19, the resistance 21, and the lead 22 is again restored so that upon subsequent application of a positive going pulse from the source 36 the circuit will again function as a bi-stable multivibrator.

Figure 2:
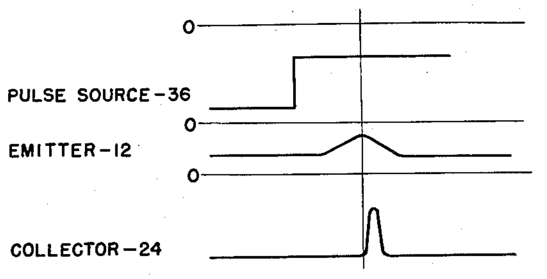
Fig. 2 is a wave form diagram showing the potential conditions existing upon several components during operation of the multivibrator shown in Fig. 1.

Referring to Fig. 2 wave forms for the monostable operation are plotted for the (1) application of potential from the source 36, (2) the potential on the emitter 12, and (3) the potential on the collector 24 of the transistor 10.

It will be observed that a lead 43 is connected to the collector 24 and hence provides a convenient means of obtaining a pulsing output. This output will be in the form of a steady potential condition when the circuit is operated as a bi-stable multivibrator and will be a relatively sharp pulse when the circuit is operated as a monostable multivibrator (see collector 24, Fig. 2).

It should be also appreciated that all potentials applied to the circuit are negative potentials. For instance, when it was stated that a positive going pulse was applied from the source 42 to drive the junction point 39 in a positive direction, the junction point 39 was still negative with respect to ground potential but was positive with respect to any of the potentials applied to the collector 17. Further with the junction point 39 at a negative potential, the base potential of the transistor 10 is also negative so that when the emitter 12 rises in potential it does not ever reach ground potential but just a potential which is positive with respect to the potential applied to the point 23.

Figure 3:
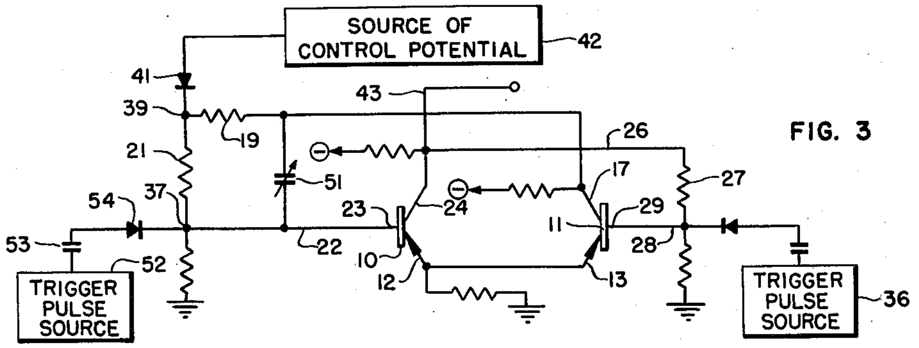
Fig. 3 is a circuit diagram illustrating another embodiment of the multivibrator circuit wherein an output of increased width is obtainable when said circuit is operated as a mono-stable multivibrator.

Referring to Fig. 3 there is shown a modified version of the circuit shown in Fig. 1. More particularly, a capacitance 51 has been connected in parallel with respect to the resistances 19 and 21. In addition, a second trigger pulse source 52 is provided. This source of trigger pulses is adapted to selectively apply positive going pulses through a capacitance 53 and through a diode 54 to the junction point 37, wherefrom said pulses may be applied over lead 22 to the base 23 of the transistor 10.

In operation of this circuit with the diode 41 biased in a back direction by a large negative potential so as not to influence the potential applied to the junction point 39, and the transistor 11 conducting, then the application of a positive going pulse from the source 36 will shut the transistor 11 off in the manner heretofore described with respect to the circuit shown in Fig. 1. As the transistor 11 commences to shut off the potential applied to the base 23 of the transistor 10 drops. Also when the transistor 11 assumes a non-conductive condition the emitter 13 potential rises to impress an increased potential on the emitter 12 of transistor 10. Immediately after the emitter 12 becomes positive with respect to base 23 the transistor 10 commences to conduct whereupon its collector potential rises to impart an increased potential over lead 26 through resistance 27 and over lead 28 to re-enforce the trigger pulse applied to the base 29. The regenerative action, attributed to the common emitter connection, the feedback connections running from the collector 24 to the base 29 and the circuit running from the collector 17 to the base 23 of transistor 10, combine to ultimately culminate in the complete shutting off of the transistor 11 and the rendering conductive of the transistor 10.

The generation of a positive going pulse by the source 52 results in an increased potential being impressed through the condenser 53 and diode 54 upon the junction point 37. The rise in potential of junction point 37 is impressed over lead 22 to the base 23 of transistor 10. The effect of the increased potential on the base 23 results in an action which is substantially identical to that described when a trigger pulse is applied from the source 36 to the base 29 of the transistor 11. The regenerative actions attributed to the cross couplings of the transistors 10 and 11 results in the shutting off of the transistor 10 and the rendering of the transistor 11 conducting.

When an increased potential is applied from source 42 through the diode 41 to the junction point 39 the circuit is now conditioned for operation as a mono-stable multivibrator. In this instance the application of a positive going pulse from source 36 raises the potential of base 29 to reduce the conductivity of transistor 11 whereupon the potential of the emitter 13 rises. This rise in emitter potential is again impressed on the emitter 12 of the transistor 10 and when it reaches a sufficiently increased value the transistor 10 will commence conduction. As previously discussed conduction of transistor 10 is followed by a rise in potential of the collector 24 to impress an increased potential on the base 29 of transistor 11 to further drive this transistor towards a state of nonconduction. This action is also accompanied by a drop in the potential of the collector 17 which is impressed over lead 18 and from there through the capacitance 51, over the lead 22 to further drive the base 23 negative and thereby favor conduction of the transistor 10. Conduction of the transistor 10 will continue for the period of time that the condenser 51 is negatively charged by the decreasing potential applied thereto. The charging of condenser 51 takes place in an exponential manner. When the transistor 11 is completely shut off, the potential of the collector 17 can no longer drop and hence negative charges are no longer applied to the condenser 51 and thereafter the condenser will discharge in an exponential manner through the resistances 21 and 19. As the condenser 51 discharges, the potential of the base 23 rises and finally the potential gradient between the base 23 and the emitter 12 is insufficient to maintain conduction of the transistor 10. Thereafter, the emitter potential of this transistor rises to impress an increased potential on the emitter 13 of transistor 11. As this action occurs the potential of the collector 24 drops to apply a decreased potential on the base 29 of the transistor 11. As soon as the emitter 13 goes positive with respect to the base 29 the transistor 11 will again commence conduction to restore the circuit to its mono-stable initial condition.

It might be noted that when the transistor 11 was driven toward a state of nonconduction a drop in the potential of the collector 17 was not impressed through the resistances 19 and 21 because the junction point 39 was at an elevated value controlled by the potential applied thereto from the source 42; thus, the D.C. coupling between the collector 17 and base 23 was rendered ineffective. The only coupling existing between the collector 17 and base 23 is then, in effect, an A.C. coupling through the condenser 51. It may be appreciated that by varying the size of the condenser 51 it is possible to accordingly vary the time that the transistor 10 is held conductive during a cycle of operation of the mono-stable multivibrator.

Figure 4:
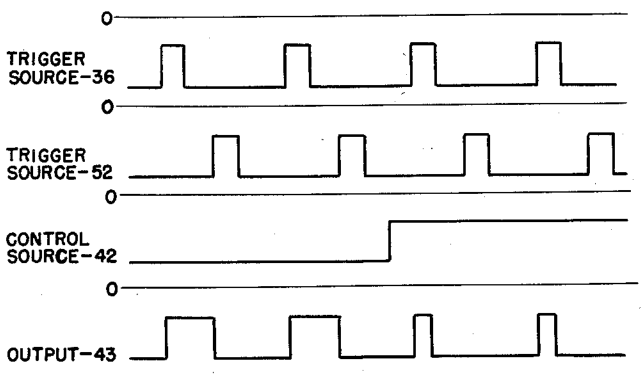
Fig. 4 is a schematic diagram showing potential conditions existing on various components of the multivibrator shown in Fig. 3 during different conditions of operation.

Looking at Fig. 4 there is shown the potential conditions applied to the circuit by the control sources 36, 52 and 42 and the output obtained on the lead 43 for various control conditions. It will be noted that when the potential from the source 42 is at a large negative value, the application of pulses from the sources 36 and 42 will cause the circuit to operate as a bi-stable multivibrator to produce an output on the lead 43 upon alternate application of trigger pulses from the sources 52 and 36. When the negative potential supplied from the source 42 decreases and the potential at point 39 rises, it will be noted that only the trigger source 36 will be capable of actuating the multivibrator circuit to produce an output on the lead 43. In this instance, when trigger pulses are supplied from source 52 they are ineffective to control the operation of the now monostable multivibrator circuit.

It is to be understood that the above-described circuit components and arrangement of components are simply illustrative of two applications of the principles of the invention and many other modifications may be made without departing from the invention.

What is claimed is:

1. In a multivibrator circuit, a pair of transistors each having an emitter, a collector and a base, means coupling the emitters together and to one end of a resistance with the other end of the resistance connected to a reference potential, a first resistive coupling between the collector of a first of said transistors and the base of the second of said transistors, a second resistive coupling between the collector of the second transistor and the base of the first transistor, a capacitance connected in parallel with the second resistive coupling, means for applying potential to said collectors to render conductive the second transistor, means for rendering said second transistor nonconductive whereby said common emitter potential rises to render said first transistor conductive and means for selectively applying one of two control potentials to said second resistive coupling to cause said second resistive coupling and capacitor to operate in shunt relation to cause said circuit to operate as a bi-stable multivibrator and for applying the other of said control potentials to said resistive coupling to cause only said capacitance to couple the collector of said second transistor to the base of said first transistor to cause said circuit to operate as a mono-stable multivibrator.

2. A dually-stable circuit which comprises a pair of amplifiers each of which includes an output electrode and an input electrode, a direct-current coupling means connected between the output electrode of each of the amplifiers and the input electrode of the other amplifier, an alternating-current coupling means connected in shunt relationship with one of the direct-current coupling means, and a source of control potential of two magnitudes connected to the shunt-connected coupling means, a potential of one of the magnitudes of the control-potential source rendering both direct-current coupling means effective to provide bistable operation of the amplifiers, and the second magnitude of the control-potential source rendering the shunt-connected direct-current coupling means ineffective and only the alternating-current coupling means effective to provide monostable operation of the amplifiers.

3. A dual-stability multivibrator circuit which comprises a pair of transistors each of which includes an emitter, a collector and a base, a direct-current coupling means connected between the collector of each of the transistors and the base of the other transistor, an alternating-current coupling means connected in parallel with one of the direct-current coupling means, a pair of pulse sources for alternately applying triggering pulses to the bases of the transistors, and a source of dual-level control potential connected to the parallel-connected coupling means, a first of the control-potential levels rendering both direct-current coupling means effective and causing the transistors to operate as a bistable multivibrator in which the conditions are reversed by the alternate applications of the triggering pulses, and the second of the control-potential levels rendering the parallel-connected direct-current coupling means ineffective and causing the transistors to operate as a monostable multivibrator which is placed in an unstable condition by one of the triggering pulses and returned to a stable condition by the alternating-current coupling means.

4. In a trigger circuit, a pair of amplifiers each of which includes an output electrode and an input electrode, a direct-current coupling means connected between the output electrode of each of the amplifiers and the input electrode of the other amplifier, an alternating-current coupling means connected in shunt relationship with one of the direct current coupling means, a voltage-sensitive valve connected to said shunt-connected coupling means, and a selectively operable source of control potential of two magnitudes connected to said voltage-sensitive valve, one of said magnitudes of control potential being effective to operate said valve to render both direct-coupling means effective to provide bistable operation of the circuit, and the other of said magnitudes of potential effective to operate said valve to render the shunt-connected direct-current coupling means ineffective and to render only the alternating-current coupling means effective to thereby provide monostable operation of said circuit.

5. In a trigger circuit, a pair of transistors each of which includes an emitter, a collector and a base, a direct-current coupling means connected between the collector of each of the transistors and the base of the other transistor, and alternating-current coupling means connected in parallel with one of the direct-current coupling means, a voltage sensitive valve connected to said parallel connected direct-current coupling means, a pair of pulse sources for alternately applying trigger pulses to the bases of the transistors, and a selectively operable source of dual level control potential connected to said valve, one of the control potential levels being effective to operate said valve to render both of said direct-current coupling means effective and to cause the transistors to operate as a bistable multivibrator in which the conditions are reversed by alternating applications of the trigger pulses, and the other of said control potential levels being effective to operate said valve to render the parallel connected direct-current coupling means ineffective to cause the transistors to operate as a monostable multivibrator which is placed in an unstable condition by one of the trigger pulses and returned to a stable condition by the alternating-current coupling means.

References Cited in the file of this patent

UNITED STATES PATENTS

| | | |
|---|---|---|
| 2,551,103 | Dickinson | May 1, 1951 |
| 2,568,918 | Grosdoff | Sept. 25, 1951 |
| 2,569,345 | Shea | Sept. 25, 1951 |
| 2,622,212 | Anderson et al. | Dec. 16, 1952 |
| 2,641,717 | Toth | June 9, 1953 |
| 2,665,845 | Trent | Jan. 12, 1954 |
| 2,707,752 | Gabler | May 3, 1955 |
| 2,827,574 | Schneider | Mar. 8, 1958 |

OTHER REFERENCES

"The Transistor" publication by Bell Laboratories Inc., page 480, published December 4, 1951.

Electronics, December 1954, Transistors Use Emitter-Coupled Feedback by Alexander, Jr., pp. 188 to 192.